United States Patent [19]

Devin

[11] Patent Number: 4,964,079
[45] Date of Patent: Oct. 16, 1990

[54] ELECTRICALLY PROGRAMMABLE MEMORY WITH SEVERAL INFORMATION BITS PER CELL

[75] Inventor: Jean Devin, AIX En Provence, France

[73] Assignee: SGS-Thomson Microelectronics, Gentilly, France

[21] Appl. No.: 342,476

[22] Filed: Apr. 24, 1989

[30] Foreign Application Priority Data

Apr. 26, 1988 [FR] France ................ 88 05511

[51] Int. Cl.⁵ .............. G11C 11/56; G11C 11/34
[52] U.S. Cl. .................... 365/168; 365/184
[58] Field of Search .............. 365/168, 184, 185

[56] References Cited

U.S. PATENT DOCUMENTS

| | | | |
|---|---|---|---|
| 4,653,023 | 3/1987 | Suzuki et al. | 365/168 |
| 4,794,564 | 12/1988 | Watanabe | 365/184 |
| 4,809,227 | 2/1989 | Suzuki et al. | 365/168 |
| 4,847,808 | 7/1989 | Kobatake | 365/168 |

FOREIGN PATENT DOCUMENTS 58-137181  8/1983  Japan .

OTHER PUBLICATIONS

IEEE Transactions on Computers, vol. L-35, No. 2, D. A. Rich, Feb. 1986, pp. 99–104.
IEEE Journal of Solid State Circuits, vol. SC-11, No. 4, R. A. Heald, Aug. 1976, pp. 519–528.

*Primary Examiner*—Stuart N. Hecker
*Assistant Examiner*—Michael A. Whitfield
*Attorney, Agent, or Firm*—Roland Plottel

[57] ABSTRACT

The disclosure concerns electrically programmable memories and, notably, the memories known as EPROMs, EEPROMs, FLASH-EEPROMs. To increase the information storage capacity of a memory, it is proposed to define at least three (instead of two) sections of current coming from a cell to which reading voltages are applied. These sections correspond to n possible programmed states of the cell. Comparators define a piece of information stored, for example, in two-bit form on the outputs S1, S2. However, to ensure safety during the reading despite programming uncertainties, the cell is tested by means of additional comparators and, if the cell current measured for a programming level defined among n levels is too close to the current threshold that defines the programming threshold at this level, an operation for complementary programming of the cell is triggered.

3 Claims, 4 Drawing Sheets

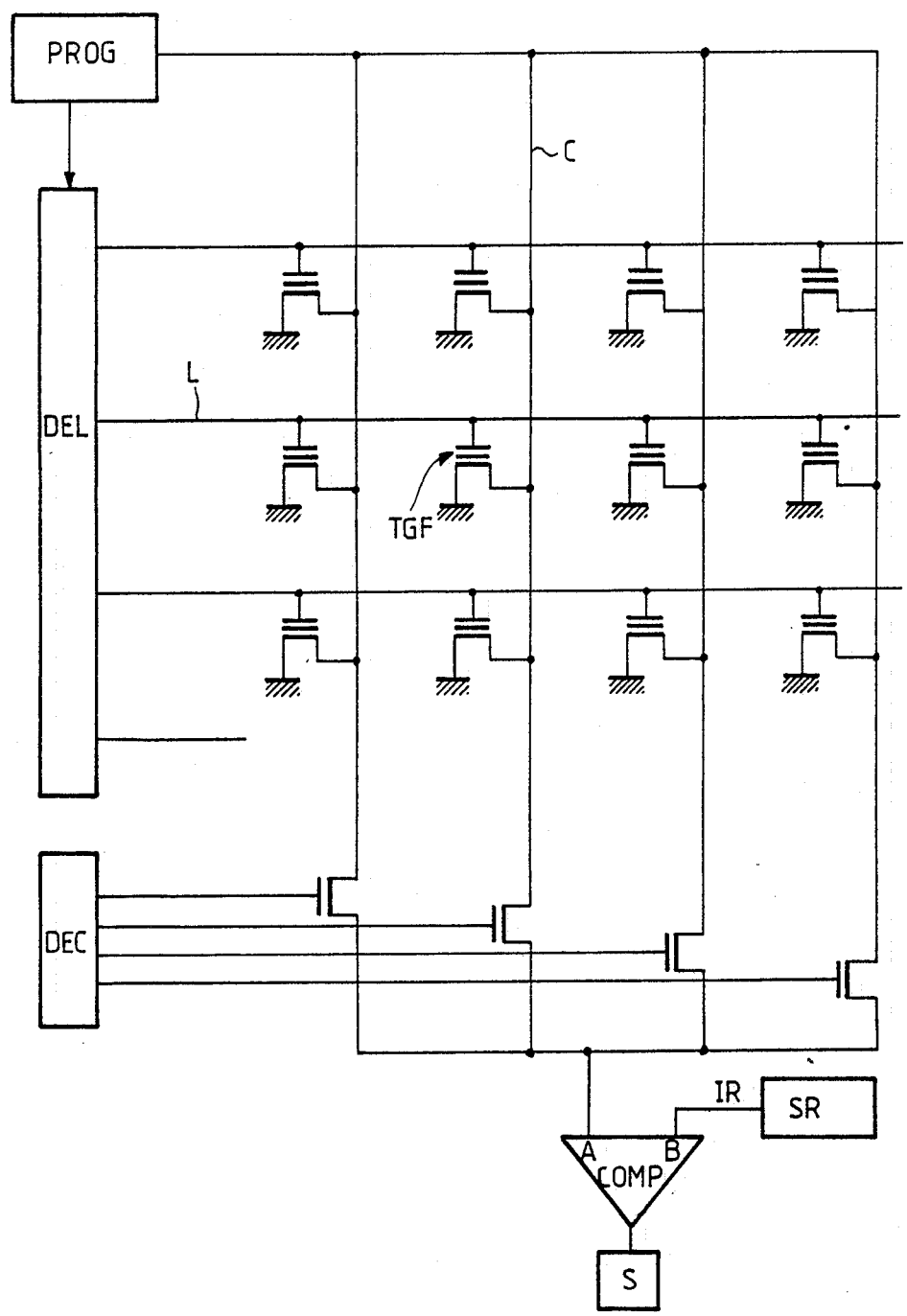
FIG_1 PRIOR ART

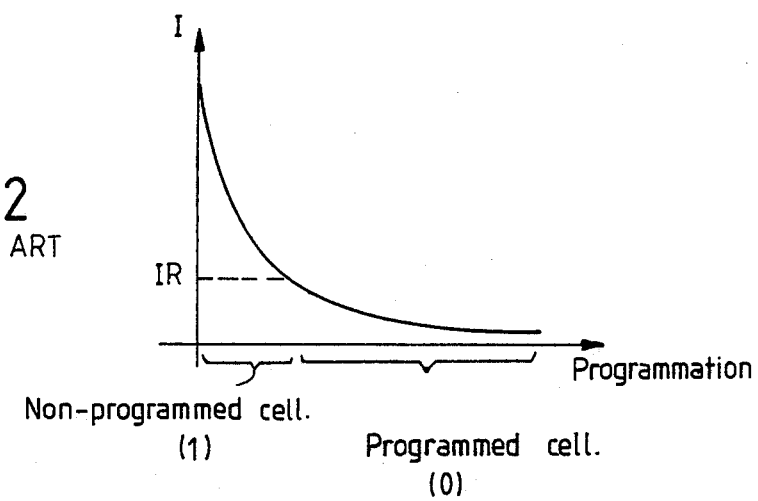
FIG_2
PRIOR ART
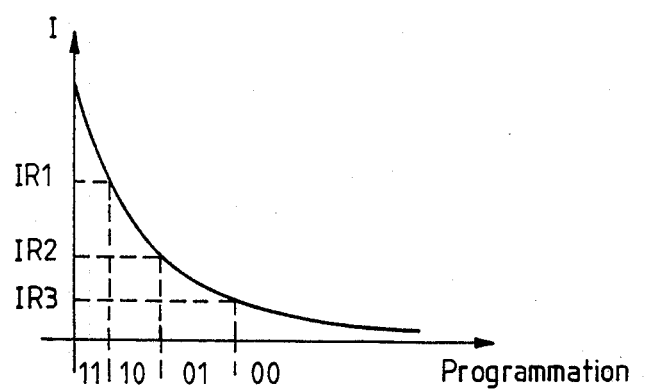
FIG_3
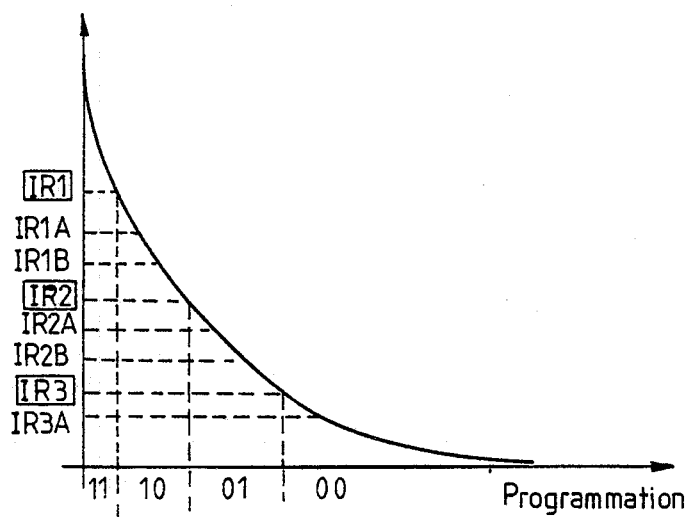
FIG_4

FIG_5
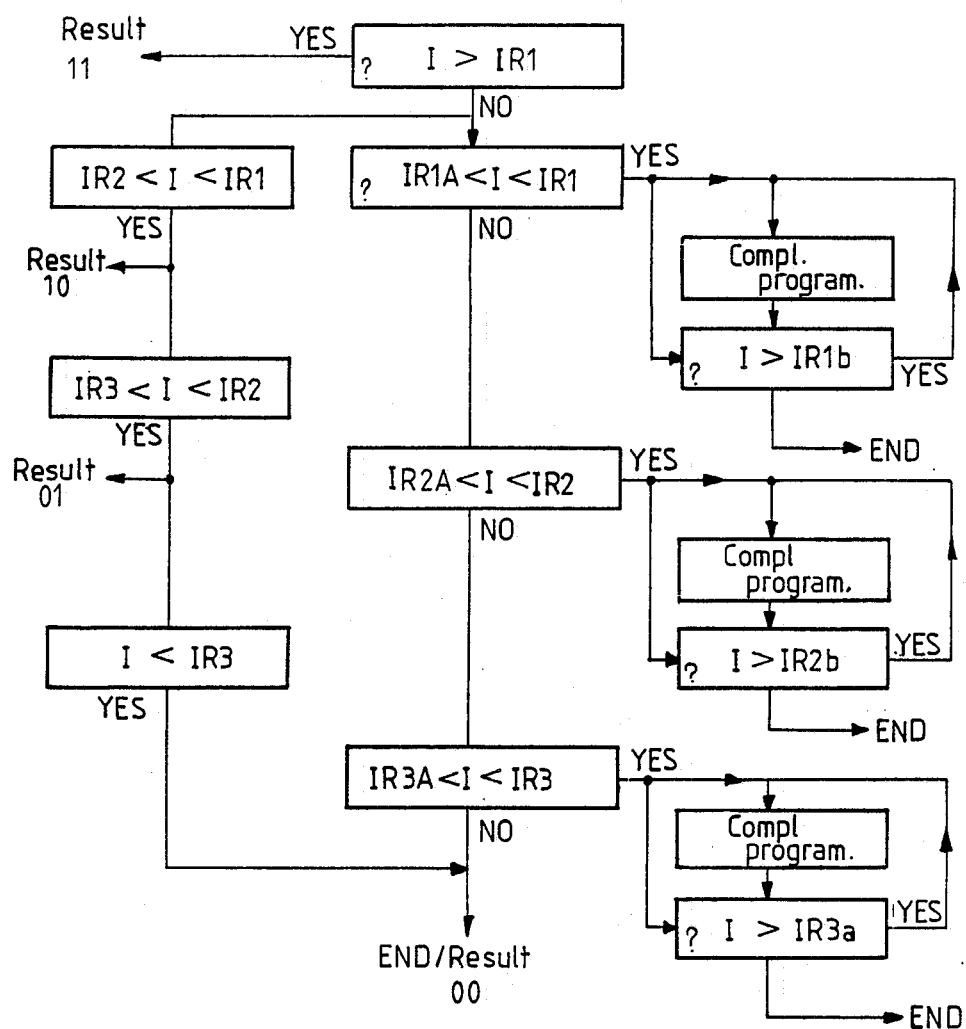

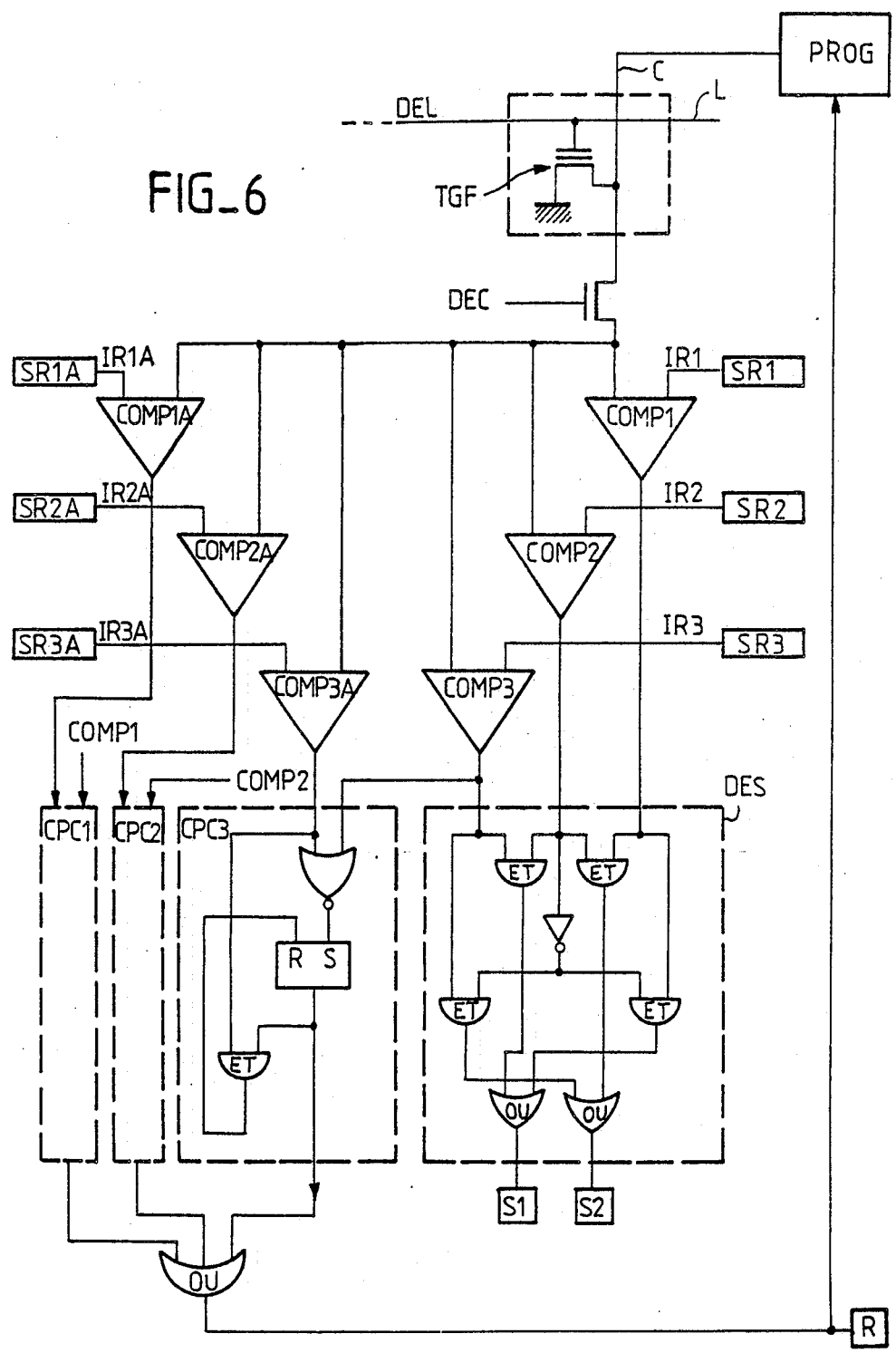
FIG_6

ELECTRICALLY PROGRAMMABLE MEMORY WITH SEVERAL INFORMATION BITS PER CELL

BACKGROUND OF THE INVENTION

1. Field of the Invention

The invention concerns electrically programmable memories and, notably, the memories known as EPROMs, EEPROMs, FLASH-EEPROMs which correspond to various alternative types of memories for which the programming is done by introducing electrical charges into the floating gate of a floating gate transistor forming the basic element of each elementary cell of the memory.

2. Description of the Prior Art

The programming is electrical. This means that, to program a cell of the memory, this cell is designated by means of a row decoder and, as the case may be, a column decoder and adequate voltages are applied to the designated cell, enabling charges to be injected into the floating gate.

The information stored in the memory is defined by the programmed state of each cell. This programmed state represents a piece of binary information: a cell is programmed or it is not programmed.

To read the information contained in the memory, the programmed state of the cells is examined. For this, a determined cell is addressed by means of the decoder or decoders, and appropriate reading voltages are applied to this cell. This results in an electrical current or a voltage which depends on the programmed state of the cell. By measuring this current or this voltage, it is determined whether the cell has been programmed or not programmed. It is thus possible to collect, cell by cell or cell group by cell group, the pieces of binary information stored in the memory.

More precisely, for example when each memory cell is formed by a floating gate transistor, the reading of the state of the memory cell consists of a comparison between the current coming from the addressed cell and a reference current value. The reference current value is chosen to be substantially in the middle of the interval between the value of current that would be given by a programmed cell (a value close to zero in practice) and the value of current that will be given by a non-programmed cell, with this programmed cell and this non-programmed cell receiving the same read voltages.

Thus, a current comparator, receiving, firstly, the current of the cell to be read (to which the nominal reading voltages are applied) and, secondly, the reference current will flip over unambiguously in one direction or another depending on the programmed state of the cell, thus giving a piece of binary information, at its output, representing the piece of binary information stored in the read cell.

For example, a blank (not programmed) EPROM cell will allow a current of about 200 micro-amperes to flow while a programmed cell will let through only a current of less than 20 micro-amperes under the same reading conditions. The reference chosen may be a current of 100 micro-amperes.

In practice, the current coming from the cell will be preferably converted into a voltage which is a function of this current (for example, by means of an integrator), so that the comparison could be done by a voltage comparator, which is often easier to make than a current comparator. Since the mode of comparison (by voltage or current) is not the object of the invention, and since the making of current/voltage conversions is well known, we shall confine the following explanation to current comparators while bearing in mind the fact that they may actually be voltage comparators. It may be supposed, for example, that the reference value of comparison is defined on the basis of the current coming from a reference blank cell, a current applied to a current/voltage converter for which the gain will define precisely a reference voltage.

Since the physical phenomena brought into play by programming are poorly controlled in industrial conditions, the currents that come from the blank cells and the programmed cells are not known with great precision. They depend on a great many factors including reading voltage values applied to the cells. The current of the programmed cells further depends on the intensity of the programming, namely on the quantity of charges that it has been possible to store in the floating gate of a cell. This quantity of charges depends on the programming voltage and on the period for which this voltage is applied or, again, even on the way in which it has been applied. There is therefore a very great variation between the current values of blank cells and those of programmed cells in a series of memories of one and the same manufactured batch, and even within one and the same memory.

Finally, the programming of a programmed cell gets degraded in the course of time, i.e. the quantity of charges stored in a floating gate diminishes with time especially when the temperature increases (the retention period is of the order of 10 years). The result thereof is that the current coming from a programmed cell gradually increases in the course of time, as and when the threshold voltage of the floating gate transistor gets reduced through this loss of charges.

As a result of these difficulties, it has never been attempted, until now, to envisage the possibility that a piece of information, other than a binary one, could be recorded in a single physical cell of the memory, namely in a single floating gate transistor. However, to store a piece of information other than a single bit, for example a piece of information with three states or a piece of information consisting of two bits, in a single cell, it would be enough to be able to define several voltage or current thresholds, given by the cell in reading mode (instead of a single threshold), so that the position of the current or the voltage with respect to these different thresholds would define the programmed state of the cell among several (more than two) possible states.

It would thus be possible to make great gains in terms of the overall space occupied by the memory, at least for large-capacity memories wherein the size of an elementary cell is the predominant space factor. If a cell stores, for example, two bits of information instead of only one bit, in using the same elementary surface, the overall gain can be assessed at about 25% for the entire memory for one and the same capacity of about one megabit.

This gain in area clearly represents an increase in manufacturing efficiency and, therefore, a reduction in costs.

An object of the present invention is the making of an electrically programmable memory capable of storing, in each memory cell, n possible programmed states with n being at least equal to 3.

SUMMARY OF THE INVENTION

According to the invention, there is proposed an electrically programable memory, wherein the reading of the information stored is done, in reading mode, by comparison between, on the one hand, a current or a voltage which is a function of the programmed state of the cell and, on the other hand, a reference value, said memory comprising several comparison circuits, working in reading mode, to compare the current or the voltage with n−1 main reference values of a sequence and to deduce therefrom the programmed state of the cell from among n possible states, where n is at least equal to 3, said memory also comprising several comparison circuits to compare the current or the voltage of a cell with intermediate reference values, each intermediate reference value being located between a first main reference value and a second main reference value which are consecutive values of the sequence, the memory further comprising a logic control circuit receiving the outputs of the comparison circuits to control the execution of an operation for complementary programming of the cell if the current or the voltage is between a main reference value and the intermediate reference value that follows it, and to stop this complementary programming when the current or the voltage measured reaches a determined threshold between the intermediate value and the second main value.

It is possible to provide for this threshold to be identical to the intermediate reference value itself, or on the contrary, for it to be formed by another intermediate value, between the first intermediate value and the second main reference value.

The rest of the description will give a clearer idea of the role of the intermediate reference values, but it can be briefly stated that the main reference values define the current or voltage thresholds with reference to which the programmed state of the memory will be determined. The first intermediate reference values define safety thresholds enabling pieces of information to be stored in the cells with a low risk of loss of charges. The second intermediate reference values define, for a determined programmed state, a programming limit beyond which the programming of the cell should not be continued if it is desired to avert the risk of going to a following programmed state.

BRIEF DESCRIPTION OF THE DRAWINGS

Other characteristics and advantages of the invention will appear from the following detailed description, made with reference to the appended drawings, of which:

FIG. 1 gives a schematic view of a standard organization of an electrically programmable memory;

FIG. 2 gives a schematic view of a curve of current generated by a memory cell in reading mode as a function of the programmed state of the cell, with the standard definition of two programmed states;

FIG. 3 gives a schematic view of the same curve and the way to store, in a single cell, two bits of information defined by means of four possible programming levels;

FIG. 4 again shows a current curve with a definition of three main reference levels and five intermediate reference levels;

FIG. 5 shows a flow chart of the working of the memory according to the invention;

FIG. 6 is a diagram of an embodiment of the memory according to the invention.

DESCRIPTION OF PREFERRED EMBODIMENTS

FIG. 1 shows a memory organized in a network of rows and columns of floating gate transistors, each transistor forming an individual memory cell and being placed at the intersection of a row and a column of the memory.

The sources of the transistors are connected to a common electrical ground, the drains of the transistors of one and the same column are connected to a specific column conductor of this column. The control gates of the transistors of one and the same row are connected to a specific row conductor of this row.

A row decoder DEL enables the selection of a determined row and the application, to the corresponding row conductor L, of a reading voltage (in reading mode) or programming voltage (in programming mode) or test voltage (in test mode).

A column decoder DEC enables the selection of a determined column and the connection of the corresponding column conductor C (in reading or test mode) to a reading circuit which is symbolized in FIG. 1 by a current comparator COMP. The comparator then has a first input A connected to the column C and a second input connected to a reference current source SR giving a reference current IR (cf. reference made earlier to the possibility that the comparison can be made on the basis of voltages rather than currents). The output of the comparator is connected to an output terminal S of the memory. At this terminal there appear the logic levels correponding to the pieces of information programmed in the cells. It may noted that the pieces of information to be stored in the cells are also applied to the terminal S from the outside, to be transmitted towards the columns in programming mode.

In reading mode, as in test or programing mode, the floating gate transistor TGF, located at the intersection of the row L and the column C, is selected and may be read or tested or programmed.

FIG. 1 also has a symbolic representation of a programming circuit PROG which provides the voltages needed for programming, which are higher than in reading or test mode.

The test consists, in practice, in applying the same voltages as in reading mode, and in ascertaining that, for each cell tested, the comparator COMP gives a logic level, at the output terminal S, corresponding to the information theoretically stored in the cell: level 0 for the programmed cells and level 1 for the non-programmed cells.

FIG. 2 shows the curve of the current as a function of the programmed state of the cell. The more intense the programming, the weaker is the current generated in reading mode. For more intense programming, there is an increase made either in the voltages applied to the cell in programming mode or in the period of application or, again, in the number of calibrated programming voltage pulses.

A reference current level IR, which is intermediate between the current normally generated by a blank cell and the current normally generated by a programmed cell, enables two programmed states of the cell to be distinguished. The cell is blank (state 1) if the current read is greater than IR. It is programmed (state 0) if the current is smaller than IR. The information stored by a cell is a piece of binary information.

FIG. 2 shows, for the same current curve as a function of the programming intensity, three current reference levels IR1, IR2, IR3 in descending order. These three levels define four possible programmed states, hence one piece of two-bit information.

For example, the state 11 corresponds to a blank cell (first programming level corresponding to no programming), the current generated in reading being greater than IR1. The state 10 corresponds to a second level for which the current generated is between IR1 and IR2. The state 01 corresponds to the third level (I between IR2 and IR3), and the state 00 corresponds to the fourth level (I between IR3 and zero).

FIG. 4 again shows the same curve, but with other reference current values which are intermediate reference values between the main reference values IR1, IR2, IR3 defined in FIG. 3. These values can be broken down into first intermediate reference values IR1A, IR2A, IR3A and second intermediate reference values IR1B and IR2B. The first intermediate values IR1A, IR2A and IR3A are the most important ones and, besides, in a particular embodiment, it is quite possible to provide for the second values to be identical to the first ones (i.e. more precisely, for IR1B to be equal to IR1A and IR2B to be equal to IR2A).

Each intermediate reference value is between two main consecutive values of the sequence IR1, IR2, IR3. The value IR1A is between IR1 and IR2. The value IR2A is between IR2 and IR3, etc.

If the second intermediate reference values are not identical to the first ones, then the sequence of values is, in the order of current values corresponding to programming operations in ascending order: first main value (for example IR2), then first intermediate value (IR2A), then second intermediate value (IR2B) and, finally, second main value (IR3).

We then define the same programmed states as in FIG. 3, namely four states, 11, 10, 01, 00, as those distinguished from one another as a function of the main reference levels IR1, IR2, IR3. In reading mode, the current generated by this cell will be compared with these three values and the two bits of information contained in the cell will be deduced therefrom by a simple logic circuit.

The first intermediate reference levels define the levels of programming safety. It is assumed, according to the invention, that a cell which has to be programmed to the nth state (for example the 2nd state for which the binary representation is 10) must give not only a current included between the reference values IRn-1 and IRn (herein IR1 and IR2) where IRn-1 represents the threshold of passage between the state n-1 and the state n but, more precisely, a current below the ancillary reference value $IR_{n-1}A$ which immediately follows (in the order of the currents corresponding to an ascending order of programming) the main reference value IRn-1. If not, if the current generated is too close to the reference value which defines the passage between the programming level n-1 and the level n, this cell will be considered to be insufficiently programmed and it will be assumed that there is a notable risk of loss of charges in the course of time. This risk cannot be accepted in a context where the programming levels have to be all the more perfectly defined as their number is greater and as the currents corresponding to the changes in programming level are closer to one another.

The second intermediate reference levels somewhat similarly define (but it will be seen that they are less important than the first intermediate reference levels) the programming limits beyond which a cell should not continue to be programmed if it is sought to avoid the risk of programming it in the following state.

FIG. 5 is a flow chart showing the unfolding of the operations for reading the memory according to the invention.

The current I coming from the cell is successively or simultaneously compared with the main reference values IR1, IR2, IR3. To each section of current, there corresponds a measurement result defining the programmed state of the cell. If the state is really that sought, the stored information is the right one. If not, the programming has to be started again or, as the case may be, the memory has to be discarded.

The most specific test proposed by the invention consists in further comparing, simultaneously or successively, the current coming from the cell in test mode with the main reference values IR1, IR2, IR3, and, at the same time, with the intermediate reference values which immediately follow them: IR1A, IR2A, IR3A.

If the current ranges between a main reference value IRn and the intermediate reference value IRAn which immediately follows it in the order of currents corresponding to programming levels in ascending order, then a complementary programming is triggered. This programming consists, for example, of the application of programming voltage pulses to the electrodes of the cell and it can be planned that, after each pulse or group of pulses, a new test is performed.

The complementary programming is stopped when the current coming from the tested cell becomes smaller than the second intermediate reference value (IR1B, IR2B) which immediately follows the first intermediate value for which the test is shown that the programming was insufficient.

The simplest approach is to take, as a value of IRnB, the same value as IRnA (there is an economizing on comparators), but the programming safety may be higher if the second intermediate values IRnB are different from the first intermediate values IRnA.

FIG. 6 shows an embodiment of the memory according to the invention in a case where the first and second reference values are identical, but a diagram could be proposed without difficulty if the values were to be different, in view of the explanations given in this description. There would have to be additional comparators to compare the current with the second intermediate reference values.

To simplify the description, FIG. 6 shows only one cell of the memory network (transistor TGF at the intersection of a row L and a column C), selected in reading mode by the row decoder DEL and the column decoder DEC.

Comparators COMP, COMP2, COMP3 are provided, to compare the current coming from the selected cell with the main reference values IR1, IR2, IR3, given by the reference current sources SR1, SR2, SR3.

The outputs of these comparators are applied to an output decoding logic circuit DES, which has three inputs and two outputs and gives an item of information in two bits at the two output contact elements S1 and S2 on the programmed state of the cell read, this state being defined by the outputs of the comparators.

Ancillary comparators COMP1A, COMP2A, COMP3A, each associated with one of the comparators COMP1, COMP2, COMP3, are provided to compare the current of the cell with the first intermediate reference values IR1A, IR2A, IR2A, given by current sources SR1A, SR2A, SR3A.

The output of a comparator, COMP3 for example, and the output of the associated ancillary comparator, COMP3A, are connected to the inputs of a complementary programming control logic circuit. This control circuit has the reference CPC1 for the circuit receiving the outputs of the comparators COMP1 and COMP1A, the reference CPC2 for the circuit receiving the outputs of COMP2 and COMP2A, and the reference CPC3 for the circuit receiving the outputs of COMP3 and COMP3A.

These circuits have a two-fold function: firstly, they detect the fact that a current of a selected cell is in the range between a main reference value and the intermediate reference value which immediately follows it, and thereupon trigger a complementary programming command. Secondly, when this command has been triggered, they interrupt the complementary programming when the current of the tested cell goes below the intermediate reference value which was used to trigger the complementary programming command.

The outputs of the circuits CPC1, CPC2, CPC3, are applied, for example, to an OR gate, the output of which gives a single complementary programming control signal irrespectively of the group of comparators which has triggered the order.

This single control signal is applied, for example, directly to a programming circuit PROG that enables the various programming voltages to be applied to the cells of the memory.

However, the complementary programming control signal can also be applied to an output terminal R of the memory integrated circuit, this terminal being connected to a microprocessor capable of controlling the reprogramming of the memory. When the microprocessor receives the control signal, it temporarily interrupts the normal operation of the memory and performs a complementary programming sequence. Successive reprogramming operations may be performed until the output current I of the cell becomes smaller than the current IRnA.

The detail of the circuit CPC3 is given, by way of example, in FIG. 6. The circuits CPC1 and CPC2 may be identical to the circuit CPC3.

In the example given, the comparator COMP3 gives a logic level 0 for a cell programmed at the level 00, delivering a current I smaller than IR3, and it gives a logic level 1 for a cell that is programmed at a lower level 01, 10, or 11 and delivers a current I greater than IR3.

The comparator COMP3A gives a logic level 0 if the current coming from the cell is greater than IR3A and a logic level 1 if it is smaller than IR3A.

In this way, the comparators COMP3 and COMP3A both give a logic level 0 if the current delivered by a cell is between the two reference values IR3 and IR3A. A NOR gate detects this case and delivers a control signal which can be used to trigger the complementary programming.

The output of the NOR gate may be applied to the flip-flop input S of a RS flip-flop. The output of the flip-flop is the output of the circuit CPC3 (logic level 1 when the test performed by the comparators COMP3 and COMP3A reaches the conclusion that the current is between IR3 and IR3A).

The output of the flip-flop is applied to an input of an AND gate, another input of which is validated by the output of the comparator COMP3A when the current becomes smaller than IR3A. The output of the AND gate is connected to the resetting input R of the RS flip-flop. Thus, the flip-flop actually triggers a complementary programming order for a current between IR3 and IR3A, since this order endures because of the flip-flop. Finally, the order is interrupted by the zero-setting of the flip-flop when the current tested becomes smaller than IR3A.

It is thus permanently seen to it that the cells are programmed, not only at the desired level but also with programming safety against losses of charges, which are inevitable in the course of time.

What is claimed is:

1. An electrically programable memory, wherein the reading of the information stored is done, in reading mode, by comparison between, a current or a voltage which is a function of the programmed state of the cell and, a reference value, said memory comprising several comparison circuits, working in reading mode, to compare the current or the voltage with n-1 main reference values of a sequence and to deduce therefrom the programmed state of the cell from among n possible states, where n is at least equal to 3, said memory also comprising several comparison circuits to compare the current or the voltage of the cell with intermediate reference values, each intermediate reference value being located between a first main reference value and a second main reference value which are consecutive values of the sequence, the memory further comprising a logic control circuit receiving the outputs of the comparison circuits to control the execution of an operation for complementary programming of the cell if the current or the voltage is between a main reference value and the intermediate reference value that follows it, and to stop this complementary programming when the current or voltage measured reaches a determined threshold between the intermediate value and the second main value.

2. A memory according to claim wherein the determined threshold is equal to the intermediate reference value.

3. A memory according to claim wherein the determined threshold is a second intermediate value, between the first intermediate value and the second main reference value.

* * * * *